(12) United States Patent
Grassl

(10) Patent No.: US 6,721,196 B1
(45) Date of Patent: Apr. 13, 2004

(54) SEMICONDUCTOR MEMORY CHIP MODULE

(75) Inventor: Thomas Grassl, Freising (DE)

(73) Assignee: Giesecke & Devrient GmbH (DE)

( * ) Notice: Subject to any disclaimer, the term of this patent is extended or adjusted under 35 U.S.C. 154(b) by 0 days.

(21) Appl. No.: 09/926,791
(22) PCT Filed: Jun. 19, 2000
(86) PCT No.: PCT/EP00/05625
§ 371 (c)(1), (2), (4) Date: Mar. 22, 2002
(87) PCT Pub. No.: WO01/01418
PCT Pub. Date: Jan. 4, 2001

(30) Foreign Application Priority Data

Jun. 23, 1999 (DE) .......................... 199 28 733

(51) Int. Cl.$^7$ ................................. G11C 5/06
(52) U.S. Cl. ..................... 365/63; 365/189.08
(58) Field of Search ................ 365/63, 189.08

(56) References Cited

U.S. PATENT DOCUMENTS

| 5,229,647 | A | | 7/1993 | Gnadinger ................. 257/785 |
| 5,297,006 | A | * | 3/1994 | Mizukoshi ................. 361/704 |
| 5,365,405 | A | | 11/1994 | Hoenlein et al. ........... 361/766 |
| 5,422,435 | A | * | 6/1995 | Takiar et al. .............. 174/52.4 |
| 5,514,907 | A | * | 5/1996 | Moshayedi ................. 257/723 |
| 5,809,241 | A | | 9/1998 | Hänel et al. ........... 395/200.36 |
| 5,840,417 | A | | 11/1998 | Bolger ....................... 428/323 |
| 5,973,396 | A | | 10/1999 | Farnworth ................. 257/698 |
| 6,037,661 | A | * | 3/2000 | Palagonia et al. .......... 257/723 |

FOREIGN PATENT DOCUMENTS

| DE | 195 11 775 C1 | 10/1996 |
| EP | 0 328 062 | 8/1989 |
| JP | 2-5455 A | 1/1990 |
| JP | 06291250 A | 10/1994 |

OTHER PUBLICATIONS

Betty Prince, "Semiconductor Memories", 1983, Wiley, 2$^{nd}$ edition, pp. 678–679.*

* cited by examiner

Primary Examiner—Michael Tran
(74) Attorney, Agent, or Firm—Bacon & Thomas, PLLC

(57) ABSTRACT

In a semiconductor memory chip module (2') for a smart card, a nonvolatile memory chip (EEPROM) (4) and a volatile memory chip (SRAM) (6) are stacked and coupled directly by vertical chip interconnections (16). The rapid-access volatile memory permits fast execution of programs. Permanent and safe storage of data is effected by reloading the data to the nonvolatile memory. A chip (8) with decoder circuits can be contained in a further level. Likewise integrated into a chip is a buffer capacitor (20) which is constantly recharged to a constant supply voltage during operation.

8 Claims, 1 Drawing Sheet

SEMICONDUCTOR MEMORY CHIP MODULE

BACKGROUND OF THE INVENTION

This invention relates to a semiconductor memory chip module having a plurality of memory chips of different types, in particular a plurality of memory chips executed in different production technologies. In particular, the invention relates to a semiconductor memory chip module suitable for smart cards and to a smart card equipped with such a chip module.

Currently available semiconductor memories can be assigned to different types in accordance with their production technology, their operating parameters, their capacitance, etc. Semiconductor memories can for example be divided into volatile and non-volatile memories.

In smart cards and smart card terminals it is expedient to use nonvolatile memories whose content can also be erased and overwritten. Typically used semiconductor memories for such purposes are EEPROMs.

Such EEPROMs, i.e. erasable, electrically programmable read-only memories, necessitate some circuit complexity for erasing and rewriting data and require relatively long access time in comparison to volatile memories, for example a DRAM or SRAM. If such a semiconductor memory is used during execution of software programs, only slow execution is possible for the program. In addition, an EEPROM permits only a limited number of erase and write operations, typically in the range of 10,000 to 100,000.

If the presence of a nonvolatile memory, for example an EEPROM, is required but a rapid-access memory is nevertheless desired for program execution, one idea is to provide in addition to the EEPROM for example a SRAM as a volatile memory which is then used for program execution. If the results are to be stored for some time after execution of a program, the required data can be reloaded to the EEPROM.

The different types of semiconductor memories, that is, in the present case non-volatile memories (EEPROMs) and rapid volatile memories (SRAMs), are based on different production technologies. If two such different types of semiconductor memories are used side by side, considerable effort is required for operationally interconnecting the two memories. Relatively long conduction paths are necessary between the two memories. This takes up a relatively large portion of the available chip area.

DE 196 26 337 A1 describes the simultaneous use of chips with volatile and nonvolatile memories for storing data. EP 0 328 062 A2 at the same time starts out from use in a smart card, so that EP 0 328 062 A2 has the features of the preamble of the independent claims. However, neither document indicates anything about the geometric structure or arrangement of the chips.

U.S. Pat. No. 5,840,417 describes in general the vertical arrangement and contacting of electronic chips, whereas U.S. Pat No. 5,229,647 describes the vertical arrangement and contacting of memory chips of the same type. Neither document deals with the problems resulting from the use of different types of memory chips.

SUMMARY OF THE INVENTION

The invention is based on the problem of providing a semiconductor memory chip module which permits the advantages of two types of memory chips without the stated disadvantages, that is, high production effort and long conduction paths.

This problem is solved by the features of claim 1. According to the invention, a semiconductor memory chip module with different types of memory chips is formed in that the memory chips are disposed one above the other in different levels and connected by vertical interconnections.

In an especially preferred embodiment, there is a fixed allocation of memory cells of the first memory chip to memory cells of the second memory chip, the mutually allocated memory cells being directly interconnected by the vertical connections.

In an especially preferred embodiment, the first type of memory chip is a nonvolatile memory, in particular EEPROM, and the second type a volatile memory, for example a SRAM.

The invention allows production of a semiconductor memory chip module having different types of memory chips, in particular memory chips fabricated by different production technologies. The chips can according to the invention be produced separately, with the aid of the production processes typical of them. The finished chips require relatively little chip area in each case. The finished chips are then stacked, the connections between the chips being vertical connections, i.e. requiring very little additional chip area. The chip stack is then formed as a self-contained unit, in particular packaged into one module, so that it can be mounted in a smart card.

In the simplest embodiment of the invention, two chip levels can be provided. Since each semiconductor memory includes not only the actual memory cells but also a drive circuit, referred to as a decoder here, said decoders can be formed together with the particular semiconductor chip. In an especially advantageous embodiment of the invention, however, it is provided that a further chip with decoder circuits for all memory chips of the chip module is provided in a further level. The chip occupying area is thus not increased—in the horizontal direction—by the decoder circuits in the further chip. The chip with the decoder circuits is also connected by vertical chip interconnections to the memory chip of the first or second type, depending on which chip is located directly under the chip with the decoder circuits.

A special feature in using memory chips in connection with smart cards and smart card terminals is the protection from so-called power analysis attacks. In such attacks an attempt is made with fraudulent intent to analyze current and voltage states on a circuit with the aid of special sensors in order to be able to infer protected data. If voltage and current levels which always assume one, or one of several, defined levels independently of internal circuit states are ensured on all connections, such an attack is impossible.

A constantly recharged capacitor, a so-called buffer capacitor, can be used to smooth the supply voltage for the chip to such an extent that no level changes are outwardly recognizable which could permit circuit states to be inferred.

In a preferred embodiment of the invention it is provided that an energy buffer, in particular in the form of an integrated capacitor, is formed in at least one of the levels of the chip module. Said buffer capacitor can occupy a total chip level, but in a preferred multilayer design it can also be limited only to a partial chip area so that the rest of this level is available for memory cells, decoder circuits or logic circuits. Said buffer capacitor can be used, at the end of processing of a program performed with the aid of the volatile memory, to store the results of the program and further data in the non-volatile memory. In case of a program abortion caused by external disturbing influences for example, the data necessary for restarting the program can be stored permanently in the nonvolatile memory with the aid of the buffer capacitor.

BRIEF DESCRIPTION OF THE DRAWINGS

In the following, some examples of the invention will be explained in more detail with reference to the drawing, in which.

DETAILED DESCRIPTION OF THE DRAWINGS

Figure 1:
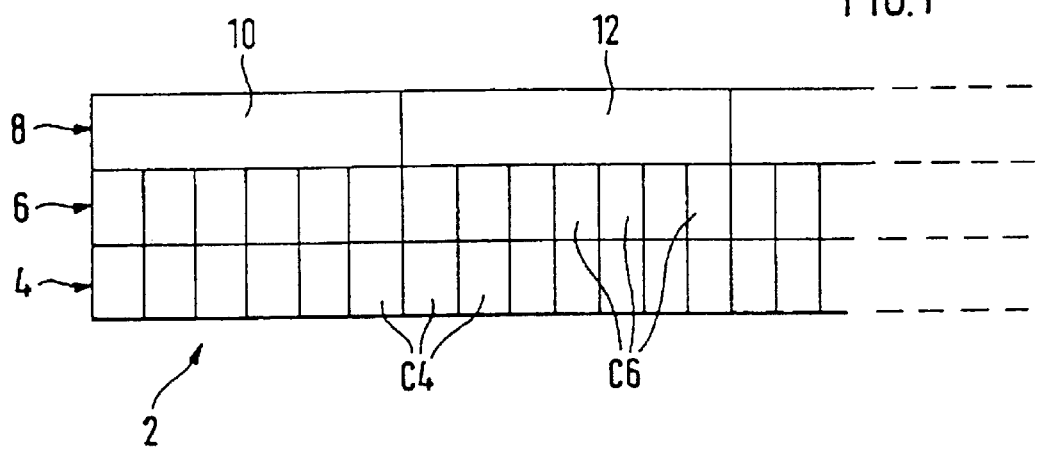
FIG. 1 shows a schematic vertical sectional view of a semiconductor memory chip module according to a first embodiment of the invention.

FIG. 1 shows semiconductor memory chip module 2 according to a first embodiment of the invention. Chip module 2 contains three stacked chips, namely bottom chip 4, formed here as an EEPROM, i.e. a nonvolatile memory chip, middle chip 6, formed here as an SRAM, i.e. a volatile memory chip, and top chip 8 comprising two types of decoder circuits 10 and 12.

Memory chip 4 contains a predetermined number of memory cells C4. Aligned therewith in the vertical direction, memory chip 6 contains a corresponding number of volatile memory cells C6.

Memory cells C4 and C6 in memory chips 4 and 6 are vertically aligned, as indicated by vertical lines in FIG. 1. Between mutually vertically allocated memory cells C4 and C6 there is a direct electric connection through so-called vertical chip interconnections, to be explained in more detail below for the example shown in FIG. 2.

Decoder circuits 10 and 12 contained in the top level in top chip 8 permit different addressing capabilities for memory chips 4 and 6. In the present embodiment, decoder circuits 10 (only one being shown in FIG. 1) serve to drive memory cells C4 in bottom memory chip 4 while decoder circuits 12 serve to drive memory cells C6 in middle memory chip 6. In a modified embodiment, however, decoder circuits 10 and 12 can also be used for both memory chips 4 and 6 in each case.

Figure 2:
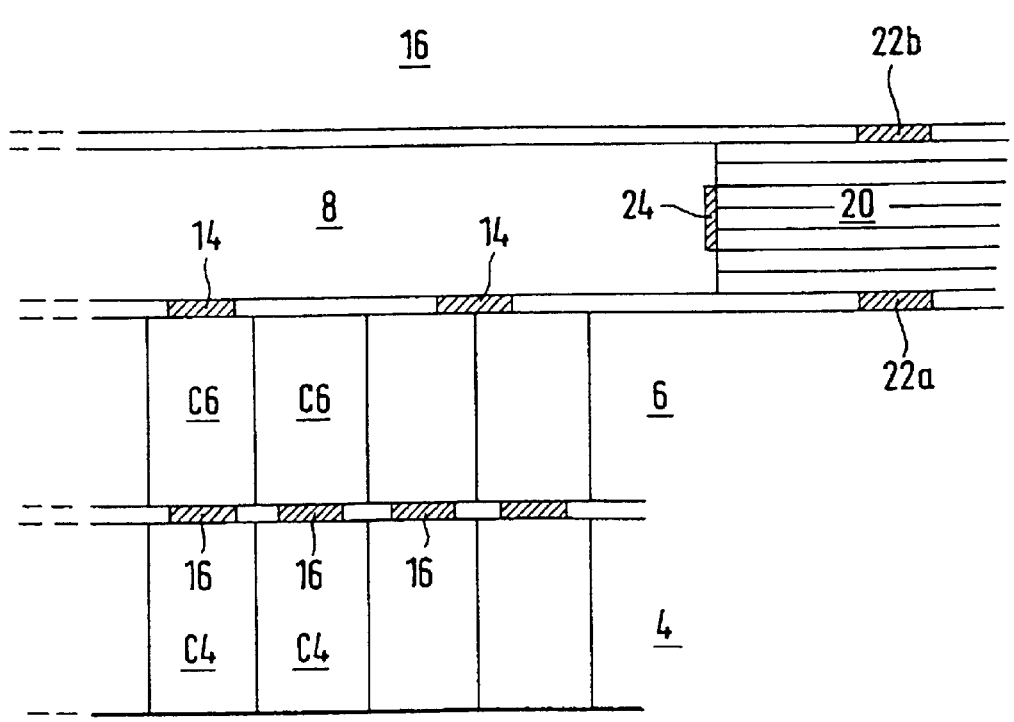
FIG. 2 shows a view similar to FIG. 1 of a second embodiment of the invention.

FIG. 2 shows a second embodiment of semiconductor memory chip module 2' which is structured on the basis of the chip module shown in FIG. 1.

As in the first embodiment, bottom chip 4 is formed as an EEPROM, in the next level above is chip 6 formed as an SRAM. Mutually vertically aligned memory cells C4 and C6 are directly connected electrically by vertical chip interconnections 16.

Similar vertical chip interconnections connect memory chip 6 with chip 8, which contains decoder circuits (not shown in detail) and additionally buffer capacitor 20. Buffer capacitor 20 is likewise connected by direct vertical chip interconnections 22a with memory chip 6 located below and by chip interconnections 22b with further chip 16 located above, and is furthermore connected by a connection indicated at 24 with the decoder circuits contained in chip 8. Through connections not shown also connect buffer capacitor 20 with bottom memory chip 4.

Semiconductor memory chip module 2' of the embodiment shown in FIG. 2 contains not only buffer capacitor 20, which acts as an energy buffer, but also chip 16 in an uppermost level, said chip containing for example logic circuits whose function is available for all other chips 4, 6 and 8.

In the embodiment according to FIG. 2, buffer capacitor 20 is produced from a plurality of alternating electroconductive and dielectric layers. A feeder (not shown) is used to hold buffer capacitor 20 constantly at a supply voltage level. Its capacitance is such that it allows data to be written from the SRAM of memory chip 6 to corresponding memory cells of the EEPROM of memory chip 4 in the case of service abortion of chip module 2' for example.

The invention and the embodiments of a chip module shown in FIGS. 1 and 2 are suitable in particular for incorporation in a smart card or smart card terminal, albeit the invention is not limited thereto. As a further modification of the invention, the order of the memory chips can be altered. In FIG. 1 various chips 4, 6 and 8 can have their order changed for example. The same holds for the arrangement according to FIG. 2. Buffer capacitor 20 can also extend over a total chip level. The decoder circuits, shown at 10 and 12 in top chip 8 in FIG. 1, can also be distributed over different chip levels.

The examples of semiconductor memory chip modules shown in FIGS. 1 and 2 contain chips 4, 6, 8 and 16 fabricated in separate production processes. The separately fabricated chips are stacked and vertically interconnected by bonding. Bonding refers in this case to connecting the individual chips or wafers containing chips. For this purpose the chips or wafers can be thinned, i.e. their thickness reduced after production. The actual electric interconnection of the individual chips or wafers is effected by vertical chip interconnections, as described above. The vertical chip interconnections are produced by a metalization process corresponding to the metalization process during production of the individual chips or wafers. This permits a high connection density, which e.g. allows individual memory cells to be interconnected electrically in different levels, i.e. on different chips, as described above. This moreover causes an increase in above. This moreover causes an increase in security since the internal vertical chip interconnections are not accessible from outside and thus cannot be tapped for analysis purposes.

The thus obtained total arrangement is encased and then available for mounting in a smart card for example. Encasing including the outwardly guided interconnecting leads will not be explained in detail here because it is conventional.

When mounted in a smart card the semiconductor memory chip module according to FIG. 1 or FIG. 2 works in such a way that the permanently stored data are located in bottom chip 4, that is, in the nonvolatile memory EEPROM. Upon execution of programs, required data are reloaded to the middle chip, that is, the volatile memory (SRAM). Middle chip 6 then acts like a cache memory. Result data and data to be protected in case of service abortion for example are then reloaded from middle memory chip 6 to bottom memory chip 4, using the energy stored in the buffer capacitor.

What is claimed is:

1. A semiconductor memory chip module comprising:
   a first memory chip of a first type;
   a second memory chip a second type; and
   an electric connection between the first and second memory chips;
   wherein the memory chips are disposed one above the other in different levels and connected by vertical chip interconnections;
   wherein memory cells of the first memory chip are firmly allocated to certain memory cells of the second memory chip, and the mutually allocated memory cells are directly interconnected electrically.

2. A chip module according to claim 1, wherein the first type corresponds to a nonvolatile memory, for example EEPROM, and the second type to a volatile memory, for example SRAM.

3. A chip module according to claim 1, wherein at least one further chip is provided in a further level.

4. A chip module according to claim 3, wherein the further chip contains decoder circuits for the memory chips.

5. A chip module according to claim 1, wherein an energy buffer is formed in at least one of the levels.

6. A chip module according to claim 5, wherein the energy buffer is formed as an integrated buffer capacitor.

7. A chip module according to claim 1, formed for a smart card.

8. A smart card having a semiconductor memory chip module according to claim 1.

* * * * *